(12) United States Patent
Yamamoto

(10) Patent No.: US 6,873,217 B2
(45) Date of Patent: Mar. 29, 2005

(54) IC FOR OSCILLATOR HAVING ELECTROSTATIC BREAKDOWN PREVENTIVE DIODES

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/309,494

(22) Filed: Dec. 4, 2002

(65) Prior Publication Data

US 2003/0107443 A1 Jun. 12, 2003

(30) Foreign Application Priority Data

Dec. 11, 2001 (JP) .................................... 2001-376597

(51) Int. Cl.⁷ .............................................. H03B 5/00
(52) U.S. Cl. ............. 331/117 R; 331/167; 331/117 FE; 331/108 C
(58) Field of Search .................... 331/117 R, 108 C, 331/177 V, 179, 167, 117 FE

(56) References Cited

U.S. PATENT DOCUMENTS 4,731,592 A  *  3/1988  Sato et al. ............. 331/108 C
5,265,716 A      11/1993 Sawada et al. ............. 200/5 R
6,147,564 A      11/2000 Nakamiya et al. ............ 331/62

FOREIGN PATENT DOCUMENTS

EP    0 846 989 A1   6/1998
JP    11-88053       3/1999

OTHER PUBLICATIONS

English language abstract of Japanese patent reference No. 11088053. Patent Abstracts of Japan published by Japanese Patent Office. It is believed that the abstract was published on Mar. 30, 1999.

* cited by examiner

*Primary Examiner*—Arnold Kinkead
(74) *Attorney, Agent, or Firm*—Brinks Hofer Gilson & Lione

(57) ABSTRACT

There are provided an internal oscillation transistor; a terminal that is connected to the base of the oscillation transistor and to which an external resonance circuit is to be connected; and two internal diodes provided between the terminal and the ground, for preventing electrostatic breakdown of the oscillation transistor. The cathodes of the two diodes are connected to each other and supplied with a reverse-bias voltage. The anode of one diode is grounded and the anode of the other diode is connected to the terminal by a first resistor. An internal second resistor for DC-grounding the terminal is also provided.

2 Claims, 3 Drawing Sheets

IC FOR OSCILLATOR HAVING ELECTROSTATIC BREAKDOWN PREVENTIVE DIODES

BACKGROUND OF THE INVENTION

1. Field of the Invention

The present invention relates to an IC (integrated circuit) for an oscillator that is particularly suitable to construct a local oscillator of a TV tuner.

2. Description of the Related Art

A conventional IC for an oscillator (hereinafter referred to simply as "IC") that is used in TV tuners will be described below with reference to FIG. 3.

An IC 60 is provided with a constant current source 63 and a pair of oscillation transistors 61 and 62 whose emitters are connected to each other. The emitters of the first oscillation transistor 61 and the second oscillation transistor 62 are connected to the constant current source 63. Voltages are applied to the collectors of the oscillation transistors 61 and 62 via power supply resistors, respectively.

The IC 60 is also provided with first to fourth coupling capacitors 64–67.

The IC 60 has a first terminal 60a and a second terminal 60b. The base of the first oscillation transistor 61 and the collector of the second oscillation transistor 62 are coupled to the first terminal 60a via the first coupling capacitor 64 and the second coupling capacitor 65, respectively. The collector of the first oscillation transistor 61 and the base of the second oscillation transistor 62 are coupled to the second terminal 60b via the third coupling capacitor 66 and the fourth coupling capacitor 67, respectively.

The IC 60 is provided with a diode 68 whose cathode is connected to the first terminal 60a and anode is grounded and a diode 69 whose cathode is connected to the second terminal 60b and anode is grounded.

The IC 60 is also provided with a constant current source 73 and a pair of oscillation transistors 71 and 72 whose emitters are connected to each other. The emitters of the third oscillation transistor 71 and the fourth oscillation transistor 72 are connected to the constant current source 73. Voltages are applied to the collectors of the oscillation transistors 71 and 72 via power supply resistors, respectively.

The IC 60 is further provided with a fifth coupling capacitor 74 that is connected to the base of the third oscillation transistor 71, a sixth coupling capacitor 75 that is connected to the collector of the fourth oscillation transistor 72, and a capacitor 76 that grounds the base of the fourth oscillation transistor 72.

The IC 60 has a third terminal 60c. The fifth coupling capacitor 74 connects the base of the third oscillation transistor 71 to the third terminal 60c. The sixth coupling capacitor 75 connects the collector of the fourth oscillation transistor 72 to the third terminal 60c.

The IC 60 is provided with a diode 77 whose cathode is connected to the third terminal 60c and anode is grounded.

The three diodes 68, 69, and 77 function as protective diodes for preventing the oscillation transistors 61, 62, and 71 from being broken due to static electricity that is introduced externally via the terminals 60a, 60b, and 60c.

If a resonance circuit is provided between the first terminal 60a and the second terminal 60b of the IC 60, a balanced oscillator is formed that functions with the first and second oscillation transistors 61 and 62. If one end of another resonance circuit is connected to the third terminal 60c and the other end is grounded, an unbalanced oscillator is formed that functions with the third and fourth oscillation transistors 71 and 72.

A first resonance circuit 81 and a second resonance circuit 82 are provided outside the IC 60. The first resonance circuit 81, which is a parallel resonance circuit having an inductance element 81a and a varactor diode 81b, is provided between the first terminal 60a and the second terminal 60b. The anode of the varactor diode 81b is DC-grounded by a resistor 81c, and a tuning voltage Vt is applied to its cathode. This oscillation circuit is used as a local oscillator for receiving a TV signal of the VHF high band.

One end of the second resonance circuit 82, which is a parallel resonance circuit having an inductance element 82a and a varactor diode 82b, is connected to the third terminal 60c and the other end is grounded. The anode of the varactor diode 82b is DC-grounded by the inductance element 82a, and the tuning voltage Vt is applied to its cathode. This oscillator is used as a local oscillator for receiving a low-band TV signal.

The diodes for preventing electrostatic breakdown of the oscillation transistors have equivalent capacitance components (about 1 pF) and are connected in parallel to the resonance circuits. Therefore, in changing the oscillation frequency by means of the tuning voltage Vt that is applied to the varactor diode of the resonance circuit concerned, the capacitance component(s) of the diode(s) remains effective even if the capacitance of the varactor diode is set at a minimum value. This means a problem that the variable ranges of the oscillation frequencies are narrowed.

SUMMARY OF THE INVENTION

An object of the present invention is to increase the variable ranges of the oscillation frequencies that are narrowed by the diodes for preventing electrostatic breakdown.

To solve the above problem, the invention provides an IC for an oscillator, comprising an internal oscillation transistor; a terminal that is connected to the base of the oscillation transistor and to which an external resonance circuit is to be connected; and an internal diode provided between the terminal and the ground, for preventing electrostatic breakdown of the oscillation transistor, the diode being supplied with a reverse bias voltage.

The diode may be a series connection of two diodes that are supplied with the reverse bias voltage.

The IC may further comprise a first resistor that is provided in series to the two diodes.

The first resistor may have a resistance of 50 to 200 Ω.

The IC may further comprise an internal second resistor for DC-grounding the terminal, and may be such that the cathodes of the two diodes are connected to each other and supplied with the reverse bias voltage, the anode of one diode is grounded, and the anode of the other diode is connected to the terminal by the first resistor.

DESCRIPTION OF THE PREFERRED EMBODIMENTS

Figure 1:
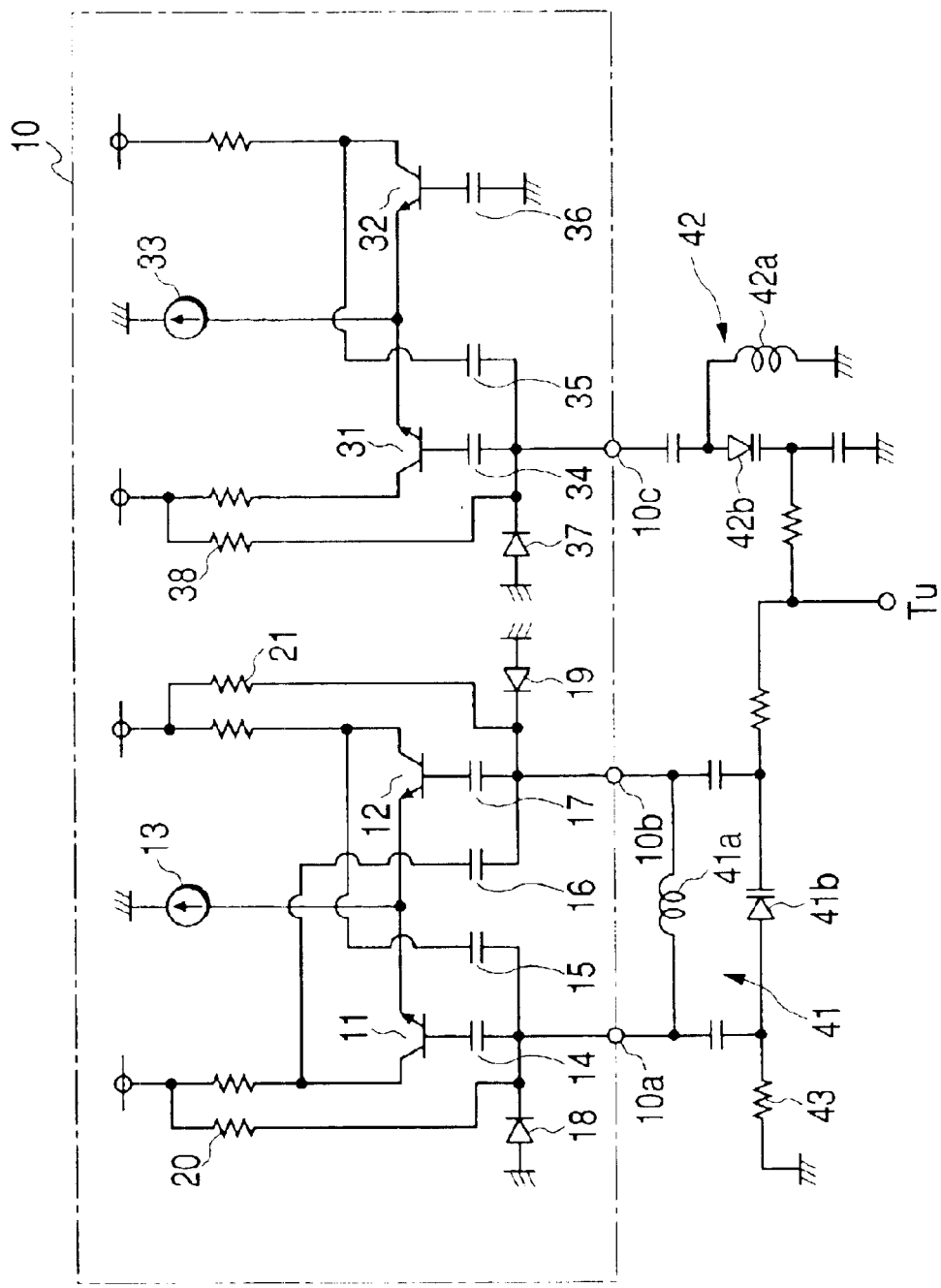
FIG. 1 is a circuit diagram showing the configuration of an IC for an oscillator according to the invention.

An IC for an oscillator (hereinafter referred to simply as "IC") according to the invention will be described below with reference to FIG. 1. An IC 10 is provided with a constant current source 13 and a pair of oscillation transistors 11 and 12 whose emitters are connected to each other. The emitters of the first oscillation transistor 11 and the second oscillation transistor 12 are connected to the constant current source 13. Voltages are applied to the collectors of the oscillation transistors 11 and 12 via power supply resistors, respectively.

The IC 10 is also provided with first to fourth coupling capacitors 14–17.

The IC 10 has a first terminal 10a and a second terminal 10b. The base of the first oscillation transistor 11 and the collector of the second oscillation transistor 12 are coupled to the first terminal 10a via the first coupling capacitor 14 and the second coupling capacitor 15, respectively. The collector of the first oscillation transistor 11 and the base of the second oscillation transistor 12 are coupled to the second terminal 10b via the third coupling capacitor 16 and the fourth coupling capacitor 17, respectively.

The IC 10 is provided with a diode 18 whose cathode is connected to the first terminal 10a and anode is grounded and a diode 19 whose cathode is connected to the second terminal 10b and anode is grounded.

The diode 18 is reverse-biased, at its cathode, with a voltage from a 5-V voltage source via a resistor 20. Similarly, the diode 19 is reverse-biased being supplied, at its cathode, with a voltage from the voltage source via a resistor 21.

The IC 10 is also provided with a constant current source 33 and a pair of oscillation transistors 31 and 32 whose emitters are connected to each other. The emitters of the third oscillation transistor 31 and the fourth oscillation transistor 32 are connected to the constant current source 33. Voltages are applied to the collectors of the oscillation transistors 31 and 32 via power supply resistors, respectively.

The IC 10 is further provided with a fifth coupling capacitor 34 that is connected to the base of the third oscillation transistor 31, a sixth coupling capacitor 35 that is connected to the collector of the fourth oscillation transistor 32, and a capacitor 36 that grounds the base of the fourth oscillation transistor 32.

The IC 10 has a third terminal 10c. The fifth coupling capacitor 34 connects the base of the third oscillation transistor 31 to the third terminal 10c. The sixth coupling capacitor 35 connects the collector of the fourth oscillation transistor 32 to the third terminal 10c.

The IC 10 is provided with a diode 37 whose cathode is connected to the third terminal 10c and anode is grounded. The diode 37 is reverse-biased, at its cathode, with a voltage from the voltage source via a resistor 38.

The three diodes 18, 19, and 37 function as protective diodes for preventing the oscillation transistors 11, 12, and 31 from being broken due to static electricity that is introduced externally via the terminals 10a, 10b, and 10c.

If a resonance circuit is provided between the first terminal 10a and the second terminal 10b of the IC 10, a balanced oscillator is formed that functions with the first and second oscillation transistors 11 and 12. If one end of another resonance circuit is connected to the third terminal 10c and the other end is grounded, an unbalanced oscillator is formed that functions with the third and fourth oscillation transistors 31 and 32.

A first resonance circuit 41 and a second resonance circuit 42 are provided outside the IC 10. The first resonance circuit 41, which is a parallel resonance circuit having an inductance element 41a and a varactor diode 41b, is provided between the first terminal 10a and the second terminal 10b. The anode of the varactor diode 41b is DC-grounded by a resistor 43, and a tuning voltage Vt is applied to its cathode. This oscillation circuit is used as a local oscillator for receiving a TV signal of the VHF high band.

One end of the second resonance circuit 42, which is a parallel resonance circuit having an inductance element 42a and a varactor diode 42b, is connected to the third terminal 10c and the other end is grounded. The anode of the varactor diode 42b is DC-grounded by the inductance element 42a, and the tuning voltage Vt is applied to its cathode. This oscillator is used as a local oscillator for receiving a low-band TV signal.

With the above configuration, since the 5-V reverse bias voltage is applied to the diodes 18, 19, and 37, their equivalent capacitances are as small as about 0.7 pF. Therefore, the residual capacitances due to the diodes 18, 19, and 37 become small and the variable ranges of the oscillation frequencies become wider than in the conventional case.

Figure 2:
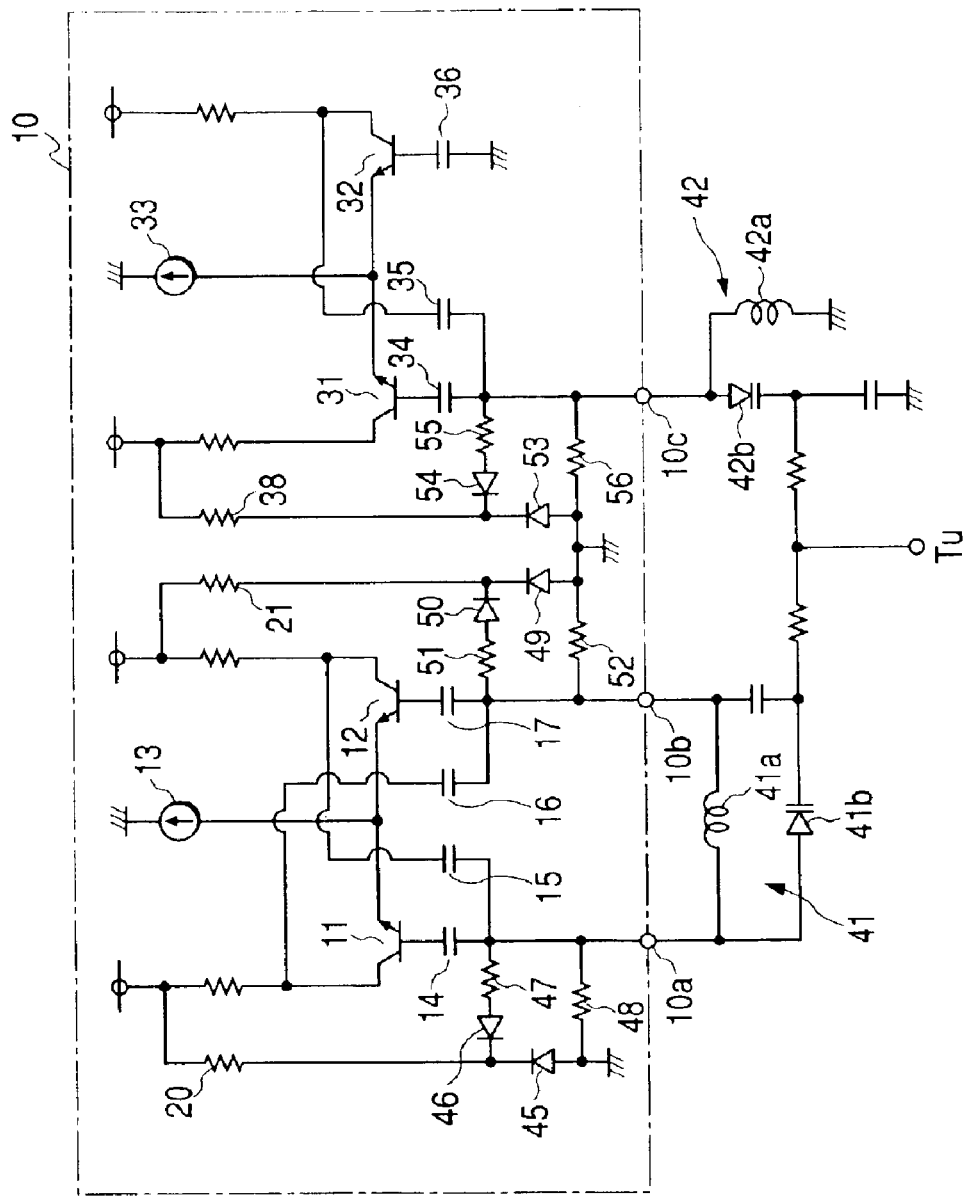
FIG. 2 is a circuit diagram showing the configuration of another IC for an oscillator according to the invention.
Figure 3:
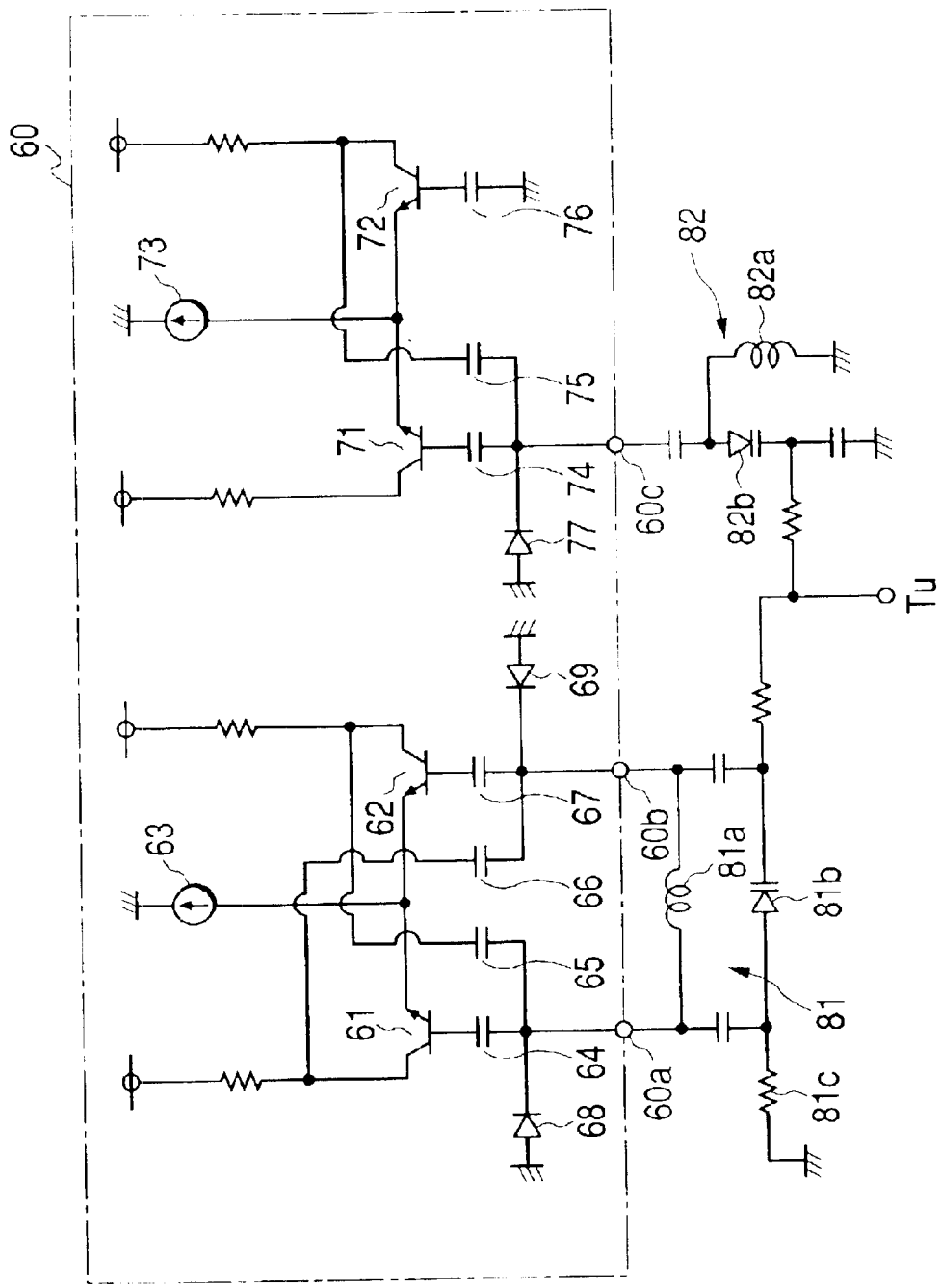
FIG. 3 is a circuit diagram showing the configuration of a conventional IC for an oscillator.

FIG. 2 shows a configuration in which two diodes for preventing electrostatic breakdown are provided for each of the terminals 10a, 10b, and 10c.

That is, a series connection of two diodes 45 and 46 is provided between the first terminal 10a and the ground. The anode of the one diode 45 is grounded and its cathode is connected to the cathode of the other diode 46. The anode of the diode 46 is connected to the first terminal 10a by a first resistor (50 to 200 Ω) 47. The first terminal 10a is DC-grounded by a second resistor 48. The voltage is applied to the cathodes of the diodes 45 and 46 via the resistor 20.

Similarly, a series connection of two diodes 49 and 50 is provided between the second terminal 10b and the ground. The anode of the one diode 49 is grounded and its cathode is connected to the cathode of the other diode 50. The anode of the diode 50 is connected to the second terminal 10b by a first resistor (50 to 200 Ω) 51. The second terminal 10b is DC-grounded by a second resistor 52. The voltage is applied to the cathodes of the diodes 49 and 50 via the resistor 21.

Further, a series connection of two diodes 53 and 54 is provided between the third terminal 10c and the ground. The anode of the one diode 53 is grounded and its cathode is connected to the cathode of the other diode 54. The anode of the diode 54 is connected to the third terminal 10c by a first resistor (50 to 200 Ω) 55. The third terminal 10c is DC-grounded by a second resistor 56. The voltage is applied to the cathodes of the diodes 53 and 54 via the resistor 38.

With the above configuration, if directly connected to the first terminal 10a, the anode of the varactor diode 41b of the first resonation circuit 41 is grounded by the second resistor 48. If directly connected to the third terminal 10c, the anode of the varactor diode 42b of the second resonation circuit 42 is grounded by the second resistor 56.

Since the series connection of the two reverse-biased diodes is provided between each terminal and the ground, the total equivalent residual capacitance is halved and the variable ranges of the oscillation frequencies can further be increased accordingly. Since the first resistor is connected in series to the two diodes, an equivalent capacitance that is added in parallel to the resonance circuit when the series circuit of the first resistor and the two diodes is converted into a parallel circuit is even smaller. Moreover, since the second resistors DC-ground the respective terminals, the two diodes can be reverse-biased by the voltage that is applied to their cathodes and the anodes of the varactor diodes of the external resonance circuits can be grounded by the second resistors.

As described above, the invention provides an IC for an oscillator, comprising an internal oscillation transistor; a terminal that is connected to the base of the oscillation transistor and to which an external resonance circuit is to be connected; and an internal diode provided between the terminal and the ground, for preventing electrostatic breakdown of the oscillation transistor, the diode being supplied with a reverse bias voltage. Therefore, the equivalent capacitance of the diode becomes small and the variable range of the oscillation frequency is increased accordingly.

Since two reverse-biased diodes are connected to each other in series, the equivalent capacitance is further reduced.

Since a first resistor is provided in series to the two diodes, an equivalent capacitance that is obtained when the series circuit of the two diodes and the first resistor is converted into a parallel circuit is even smaller.

Since the first resistor has a resistance of 50 to 200 $\Omega$, the equivalent capacitance can be decreased while the effect of preventing electrostatic breakdown is maintained.

The IC further comprises an internal second resistor for DC-grounding the terminal, and is such that the cathodes of the two diodes are connected to each other and supplied with the reverse bias voltage, the anode of one diode is grounded, and the anode of the other diode is connected to the terminal by the first resistor. Therefore, the two diodes can easily be reverse-biased. Further, when directly connected to the terminal, the anode of a varactor diode of an external resonance circuit can be DC-grounded by the second resistor. As a result, the number of parts used can be reduced.

What is claimed is:

1. An IC for an oscillator, comprising:
   an internal oscillation transistor;
   a terminal that is connected to a base of the oscillation transistor and to which an external resonance circuit is to be connected;
   a series connection of two diodes that are provided between the terminal and ground, for preventing electrostatic breakdown of the oscillation transistor, and that are supplied with a reverse bias voltage;
   a first resistor that is provided in series to the two diodes; and
   an internal second resistor for DC grounding the terminal,
   wherein cathodes of the two diodes are connected to each other and supplied with the reverse bias voltage, an anode of one of the two diodes is grounded, and an anode of the other diode is connected to the terminal by the first resistor.

2. The IC for an oscillator according to claim 1, wherein the first resistor has a resistance of 50 to 200 $\Omega$.

* * * * *